US012451314B2

(12) United States Patent
Gaska

(10) Patent No.: US 12,451,314 B2
(45) Date of Patent: Oct. 21, 2025

(54) ELECTRON BEAM DEVICES WITH SEMICONDUCTOR ULTRAVIOLET LIGHT SOURCE

(71) Applicant: Gaska Consulting, LLC, Columbia, SC (US)

(72) Inventor: Remigijus Gaska, Columbia, SC (US)

(73) Assignee: Gaska Consulting, LLC, Columbia, SC (US)

( * ) Notice: Subject to any disclaimer, the term of this patent is extended or adjusted under 35 U.S.C. 154(b) by 258 days.

(21) Appl. No.: 17/665,794

(22) Filed: Feb. 7, 2022

(65) Prior Publication Data

US 2022/0301804 A1 Sep. 22, 2022

Related U.S. Application Data

(60) Provisional application No. 63/148,227, filed on Feb. 11, 2021.

(51) Int. Cl.
*H01J 1/34* (2006.01)
*H01J 37/073* (2006.01)

(52) U.S. Cl.
CPC .............. *H01J 1/34* (2013.01); *H01J 37/073* (2013.01); *H01J 2201/3423* (2013.01); *H01J 2237/06333* (2013.01)

(58) Field of Classification Search
CPC .... H01J 1/34; H01J 37/073; H01J 2201/3423; H01J 2237/06333; H01J 3/021
See application file for complete search history.

(56) References Cited

U.S. PATENT DOCUMENTS 7,590,161 B1 * 9/2009 Hug .......................... G01J 3/10 372/74
2005/0018467 A1 * 1/2005 Naaman .................. H01J 3/021 365/145

FOREIGN PATENT DOCUMENTS

DE 69729820 T2 * 7/2005 .............. H01J 40/02

* cited by examiner

*Primary Examiner* — David E Smith
*Assistant Examiner* — Christopher J Gassen
(74) *Attorney, Agent, or Firm* — JK Intellectual Property Law, PA

(57) ABSTRACT

Devices include a semiconductor ultraviolet light source; a photocathode attached to the semiconductor ultraviolet light source; an anode; and a separation layer configured to create a vacuum gap between the anode and cathode. The semiconductor ultraviolet light source generates photoelectrons at a surface of the photocathode. The construct is configured together as a monolithic integrated element.

31 Claims, 9 Drawing Sheets

ELECTRON BEAM DEVICES WITH SEMICONDUCTOR ULTRAVIOLET LIGHT SOURCE

CROSS-REFERENCE TO RELATED APPLICATIONS

This application claims benefit to U.S. Provisional Patent Application No. 63/148,227, filed Feb. 11, 2021, which is incorporated by reference herein in its entirety.

TECHNICAL FIELD

The present disclosure relates generally to electron devices and more particularly to free electron beam pumped and controlled semiconductor light emitting devices and electronic devices.

BACKGROUND

Electron-beam technology has provided the basis for a variety of novel and specialized applications in semiconductor manufacturing, vacuum tube devices, microelectromechanical systems, nanoelectromechanical systems, and microscopy.

Free electrons generated in a vacuum can be manipulated by electric and magnetic fields to form a fine beam. Where the beam collides with solid-state matter, electrons are converted into heat or kinetic energy. This concentration of energy in a small volume of matter can be precisely controlled electronically, which brings many advantages.

Free electrons are generated using heated cathodes, high-voltage cold cathodes, and photocathodes. Photocathode technology is based on a photoelectric effect when an electron within some material absorbs the energy of a photon and acquires more energy than its binding energy and is able to leave the material. Examples of existing devices are shown in FIG. 1, FIG. 2 and FIG. 3. In FIG. 1, a laser beam irradiates a photocathode material with a photon energy sufficient to generate photoelectrons, some of which pass through an extraction pinhole and a grounded RF pillbox-cavity, and then through a target pinhole and into the targeted item. In FIG. 2 and FIG. 3, a photocathode material is irradiated by ultraviolet Light Emitting Diodes (UV LEDs) with a photon energy sufficient to generate photoelectrons from the photocathode front (FIG. 2) and back (FIG. 3) sides. Generated photoelectrons are controlled by voltage applied between anode and cathode forming electron beam. Properties of the electron beam are manipulated using additional electrodes placed in between cathode and anode.

SUMMARY

A free electron beam source and electron beam (E-beam) devices with embodiments of the present disclosure may include a semiconductor ultraviolet light source (SULS), a photocathode attached directly to a SULS or a transition layer attached to the SULS, and an anode separated from the photocathode by a vacuum gap. The photocathode may be at least partially transparent to the light provided by the SULS and photoelectrons are generated at the surface of the photocathode layer facing the anode. The photocathode may be a continuous layer, a patterned layer, a set of discs, quantum discs, quantum wires, or quantum dots. The SULS may be vertically or edge emitting UV LEDs, UV Superluminescent Diodes (SLEDs), or UV Laser Diodes (LDs). The device may include one or more control electrodes placed in between the photocathode layer and anode to manipulate a free electron beam.

The transition layer between the SULS and the photocathode may be a substrate material on which a SULS device structure is deposited and fabricated. Such substrate material may be at least partially optically transparent to the light emitted by the SULS. For a SULS fabricated using III-Nitride semiconductors (GaN, AlN, InN, BN) and their alloys (AlGaN, AlInGaN, InGaN, BInN, BGaN, BAlN, BAlGaN, BAlGaInN), suitable substrate materials include Sapphire, AlN, AlON.

In another embodiment, a transition layer between a SULS and a photocathode may include a light extraction layer to facilitate light extraction from the SULS and to enhance irradiation of the photocathode. Such transition layer may be a refraction index matching layer, a Bragg reflector, a layer with periodically modulated refraction index, a nonlinear optical crystal, an optical waveguide, or combination of at least some of such items.

In yet another embodiment, a photocathode may be attached directly to the edge of a SULS or a transition layer attached to the edge of the SULS. This embodiment may be particularly advantageous to an edge emitting SULS.

A free electron beam generated and manipulated by the device may be used to irradiate a target material placed between a photocathode and an anode. In one embodiment, such target material is a light emitting device. Free electrons absorbed inside the target light emitting device may generate non-equilibrium electron-hole pairs, which recombine and emit light determined by the energy band structure of the target device.

In another embodiment, an electron beam may pass through an opening in the anode electrode. The target device or material may be placed in the path of the electron beam.

Advantageously, certain teachings of the present disclosure may substantially reduce the size of electron beam devices and enable microscopic scale integration of hybrid semiconductor and vacuum tube device technologies. Electron beam pumping of light emitting device structures may allow generation of light without electrical injection in small footprint systems. It may also allow fabrication of a SULS with a peak emission wavelength shorter than the emission from the SULS that is used to generate photoelectrons.

DETAILED DESCRIPTION

Figure 1:
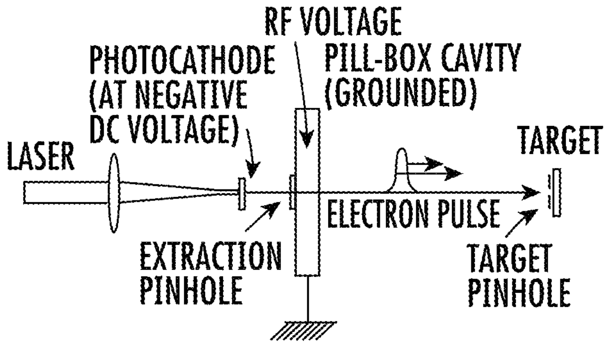
FIG. 1 PRIOR ART
FIG. 1 is a schematic illustration of an electron beam device with a photocathode irradiated with a laser beam.
Figure 2:
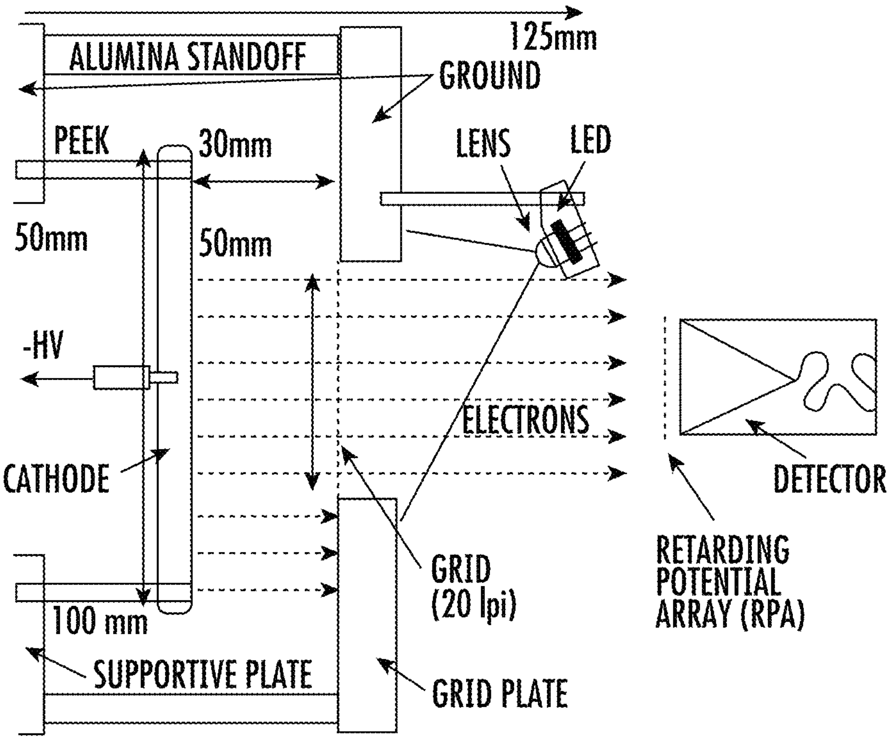
FIG. 2 PRIOR ART
FIG. 2 is a schematic illustration of an electron beam device with a photocathode irradiated using an ultraviolet Light Emitting Diode (UV LED) from the front side of the photocathode.
Figure 3:
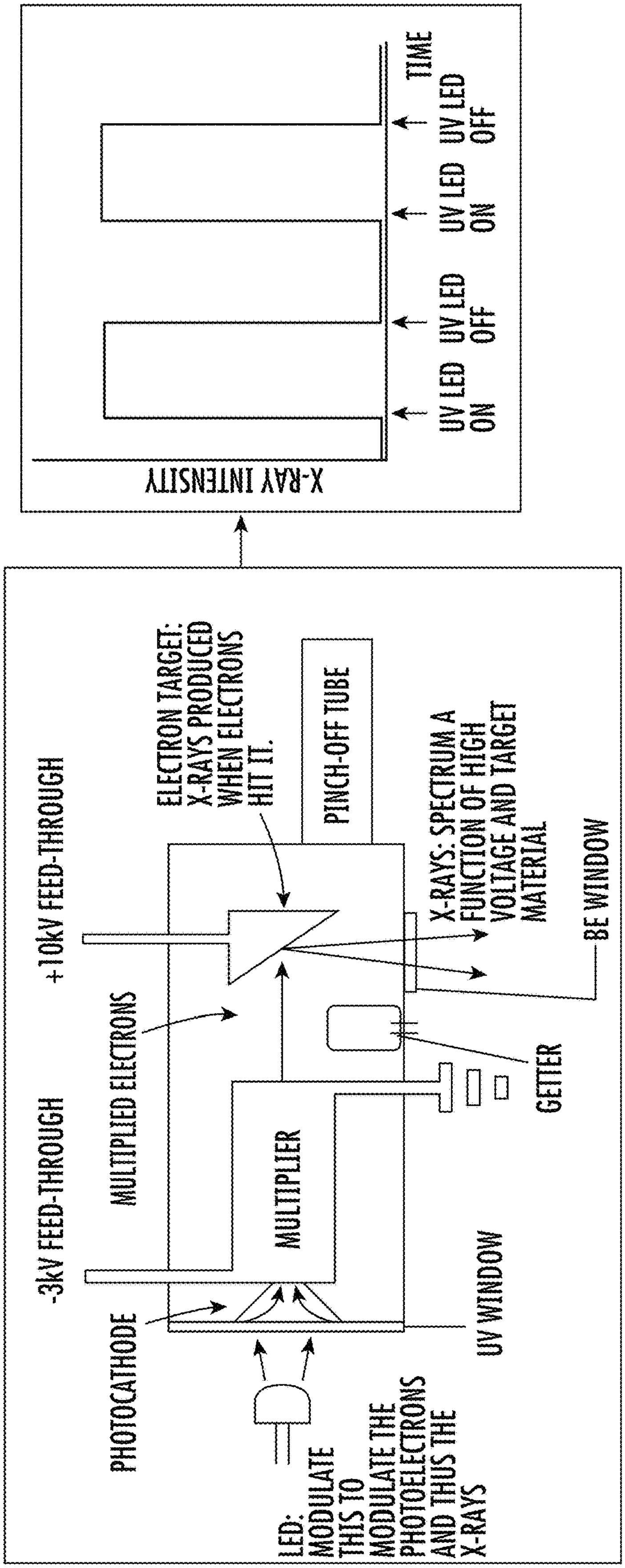
FIG. 3 PRIOR ART
FIG. 3 is a schematic illustration of an electron beam device with a photocathode irradiated using an UV LED from the back side of the photocathode.
Figure 4:
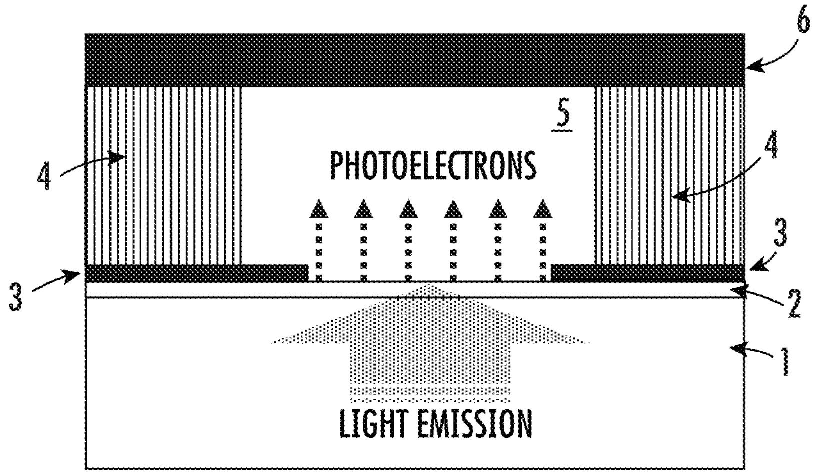
FIG. 4 is a schematic illustration of an electron beam device with a partially transparent photocathode attached to a semiconductor ultraviolet light source (SULS).

In accordance with embodiments of the present disclosure, a free electron beam may be generated using a SULS having a photon energy sufficient to cause a photoelectric effect in photocathode material. In one embodiment, the SULS are devices having at least one quantum well, quantum wire, quantum dot, or combination of at least some of the above in the active region and fabricated using III-Nitride semiconductors (GaN, AlN, InN, BN) and their alloys (AlGaN, AlInGaN, InGaN, BInN, BGaN, BAIN, BAlGaN, BAlGaInN). Referring to FIG. 4, a SULS 1 is attached to the surface of a photocathode 2. SULS 1 is a vertically emitting or edge emitting device, or a combination of both. SULS 1 is a single wavelength or multi-wavelength light emitting device. SULS 1 is a single light emitting device or light emitting device array. Photocathode 2 in FIG. 4 is partially transparent layer, and may be a single layer or a multi-layer element comprising different materials with different free electron energies, or a single layer element with a graded material composition. Ultraviolet light emitted by SULS 1 penetrates photocathode 2 and generates free photoelectrons at the surface of the photocathode opposite to the SULS surface inside a vacuum gap 5 between the photocathode and an anode 6. For example, in order to excite a photoelectric effect at the surface of an Au photocathode using ultraviolet light with a photon energy in excess of 4.5 eV, the thickness of the Au photocathode will be less than approximately 20 nm. A photocathode electrode 3 is attached to photocathode 2 to supply electrical bias to the photocathode and reduce current spreading. Photocathode 2 and photocathode electrode 3 are separated from anode 6 by a vacuum gap 5 maintained via a separation layer 4. Separation layer 4 is a dielectric or a material having a low electrical conductivity sufficient for electrical separation of photocathode electrode 3 and anode 6. A flow of free electrons from photocathode 2 to anode 6 is controlled by electrical bias applied between the photocathode and the anode.

Figure 5:
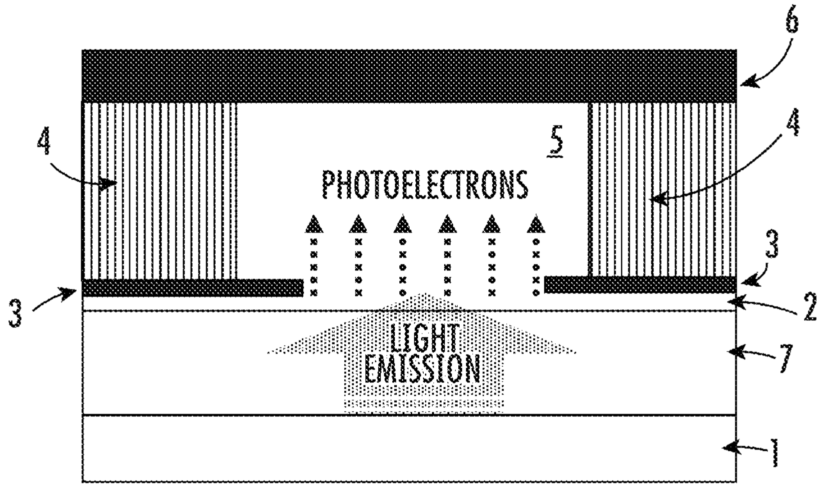
FIG. 5 is a schematic illustration of an electron beam device with a partially transparent photocathode as in FIG. 4 attached to the surface of a transition layer incorporated between the photocathode and a SULS.

Referring to FIG. 5, a photocathode 2 is attached to the surface of a transition layer 7, incorporated between the photocathode 2 and SULS 1. Transition layer 7 is a single layer such as a substrate on which SULS 1 is fabricated, or a light extraction layer or layers in order to facilitate light extraction from the SULS and enhance illumination of photocathode 2, or a combination of both. For example, for III-Nitride SULS substrates are made of Sapphire, Aluminum Nitride (AlN), Aluminum Oxynitride (AlON) or other similar materials that transmit ultraviolet light. Light extraction layers are layers having refraction index matching layer, a Bragg reflector, a layer with periodically modulated refraction index, a nonlinear optical crystal, an optical waveguide, or a combination of at least some of the above.

Figure 6:
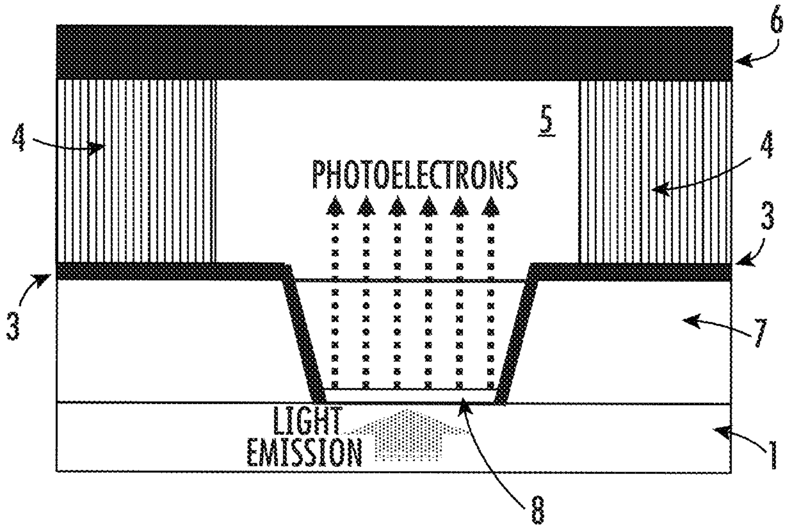
FIG. 6 is a schematic illustration of an electron beam device with a partially transparent photocathode attached to a semiconductor ultraviolet light source (SULS) in the areas where a transition layer is removed.

Referring to FIG. 6, a transition layer 7 is partially or completely removed in certain areas and a partially transparent photocathode 8 is deposited in the certain areas, whereas photocathode electrode 3 is deposited on the walls of the certain areas.

Figure 7:
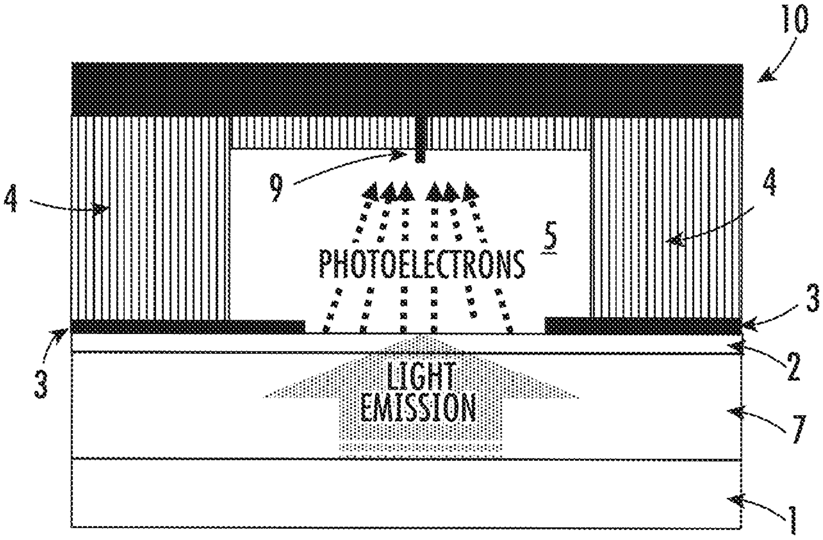
FIG. 7 is a schematic illustration of an electron beam device with an anode terminal and an anode electrode, with the anode terminal having a smaller surface area than the anode electrode area and connected to the anode electrode.

Referring to FIG. 7, in this embodiment an anode includes anode electrode 10 and anode terminal 9 having a smaller surface area than the area of the anode electrode and having an anode tip at the distal end of the anode terminal extending toward the photocathode 2. Anode terminal 9 is designed to manipulate the density and/or shape of the electron beam. In one embodiment the shape and position of anode terminal 9 is designed to significantly increase electron beam density close to the anode tip. In one embodiment anode terminal 9 is connected to anode electrode 10 having spread over top of the anode electrode and/or having connections to the anode electrode and having a separation layer 4 as in FIG. 7.

Figure 8A:
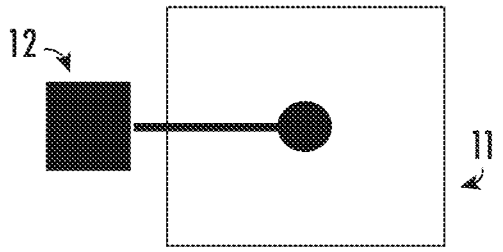
FIGS. 8A-8C are schematic Illustrations of three different embodiments of an anode having a smaller area than the area of a SULS and an anode electrode.
Figure 8B:
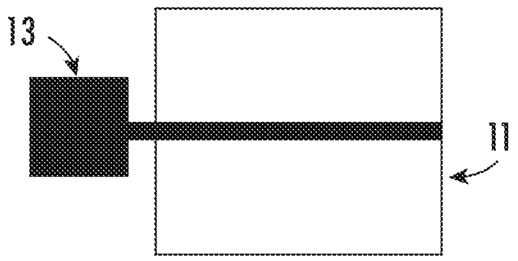
Figure 8C:
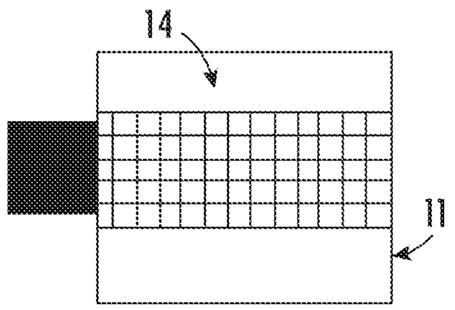

Referring to FIGS. 8A-8C, anode 12 is fabricated over a part of SULS 11 (FIG. 8A), anode 13 extends over the entire SULS 11 (FIG. 8B), or a patterned anode 14 extends across the entire SULS 11 (FIG. 8C). In another embodiment, the device has more than one anode or an array of anodes.

Figure 9:
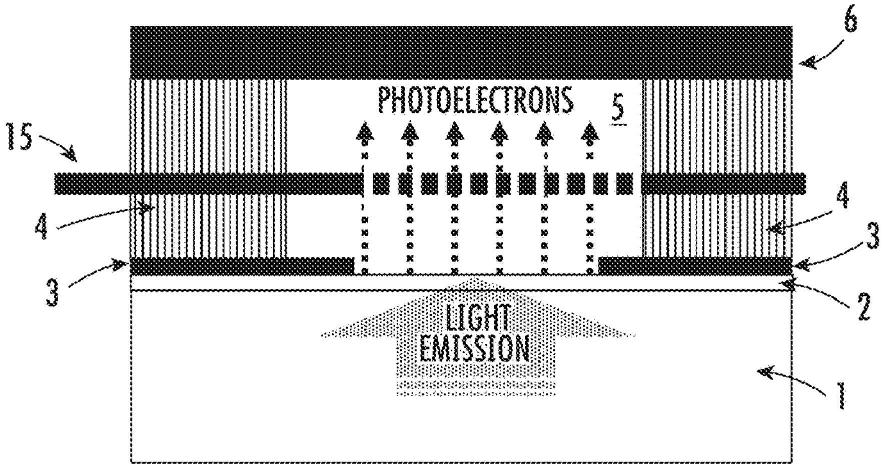
FIG. 9 is a schematic illustration of an electron beam device with a partially transparent photocathode layer attached to a SULS and one control electrode incorporated between the photocathode and the anode.

In another embodiment, referring to FIG. 9, an electron beam essentially similar to that of FIG. 4 has a controlling electrode 15 between photocathode 2 and anode 6. Controlling electrode 15, which could also be employed in the devices of FIGS. 5-7, controls photoelectron flow between the photocathode and the anode. In yet another embodiment there is more than one controlling electrode. Spacing between controlling electrodes, spacing between controlling electrodes and the photocathode, spacing between controlling electrodes and the anode, and the shape of controlling electrodes are designed to optimize desired characteristics of photoelectron flow between the photocathode and the anode.

Figure 10:
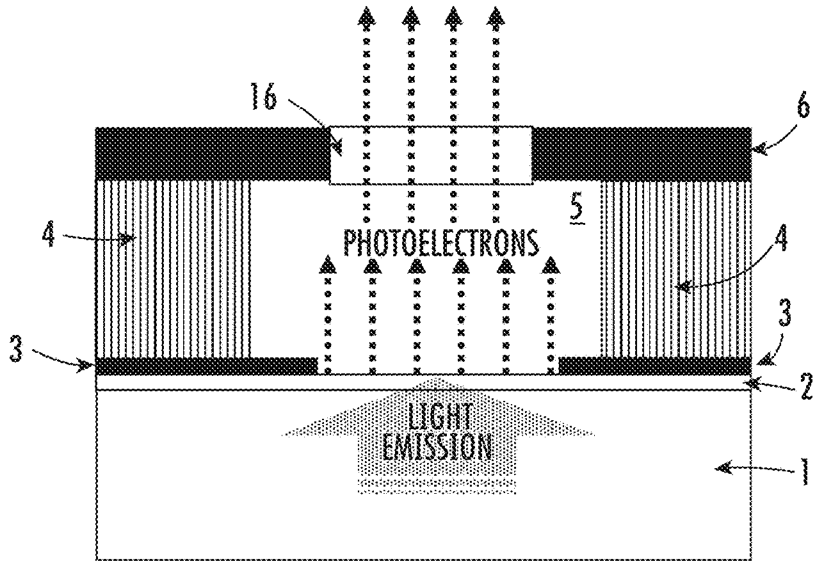
FIG. 10 is a schematic illustration of an electron beam device with a partially transparent photocathode layer attached to a SULS and an anode having a grid plate.

Referring to FIG. 10, an electron beam device is essentially similar to that of FIG. 4 has an anode 6 having an opening with a grid plate 16. An electron beam can pass through the opening with the grid plate. The grid plate can be biased and used as a controlling electrode.

Figure 11:
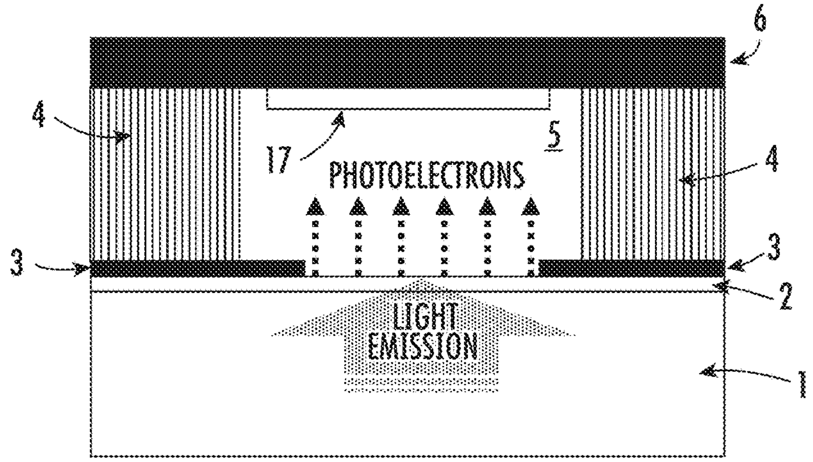
FIG. 11 is a schematic illustration of an electron beam device with a partially transparent photocathode layer attached to a SULS and a target for electron beam irradiation incorporated between a photocathode and an anode.
Figure 12:
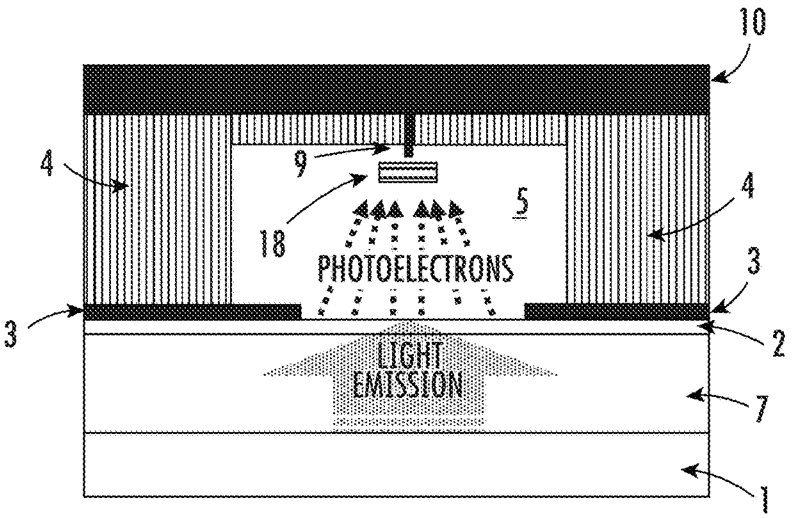
FIG. 12 is a schematic illustration of an electron beam device with a partially transparent photocathode layer attached to a SULS and a target for electron beam irradiation incorporated between a photocathode and an anode.
Figure 13:
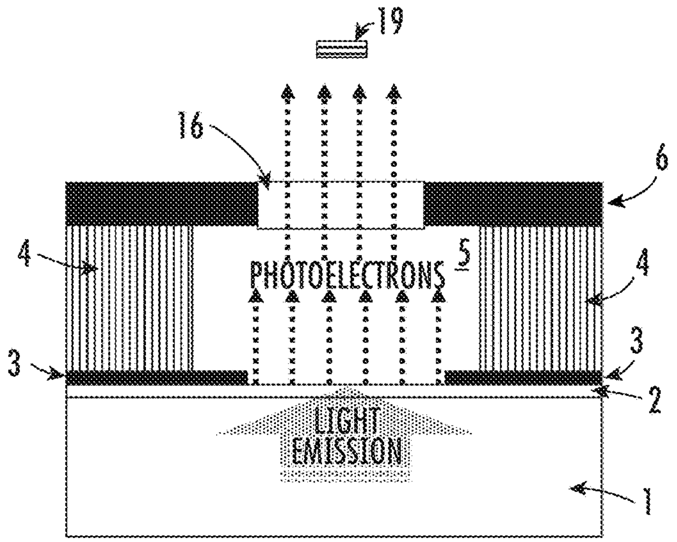
FIG. 13 is a schematic illustration of an electron beam device with a partially transparent photocathode layer attached to a SULS and a target irradiated with an electron beam through a grid plate.

Referring to FIGS. 11-12, a free electron beam generated and manipulated by the device in embodiments of FIGS. 4-10 is used to irradiate target material 17, 18 placed in between a photocathode 2 and an anode 6, or attached to an anode 6 or its anode terminal 9. Referring to FIG. 13, the target material 19 is placed within the electron beam after passing through the grid plate 16. In one embodiment such target material is a light emitting device. Free electrons absorbed inside the target generate non-equilibrium electron-hole pairs, which recombine and emit light determined by the energy band structure of the target device. In this embodiment non-equilibrium electron-hole pairs are generated inside the target without electrical current injection or simultaneously with current injection. An emission wavelength of the target light emitting device can be shorter or longer than the wavelength of a SULS which generates photoelectrons at the surface of a photocathode. Emission from the irradiated target light emitting device structure can be a spontaneous or stimulated emission. The light emitting device structure can be designed as a vertical emitting device structure or a lateral emission structure. The target device can be another type of electron device incorporated close to the anode or attached to the anode.

Figure 14:
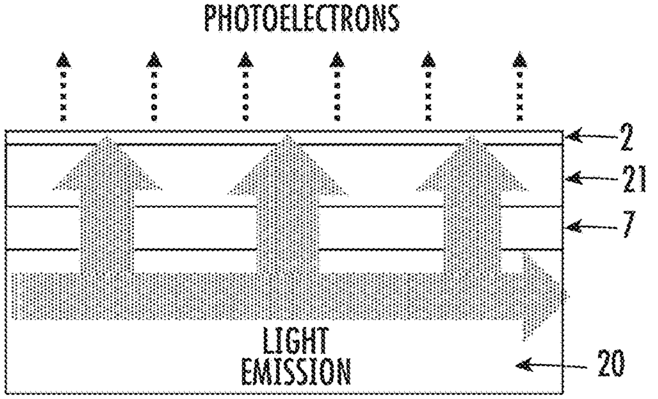
FIG. 14 is a schematic illustration of a partially transparent photocathode attached to a transition layer incorporated between a photocathode and an edge emitting SULS.

Referring to FIG. 14, a partially transparent photocathode 2 is attached to a light extraction layer 21 to facilitate light extraction from an edge emitting SULS 20.

Figure 15:
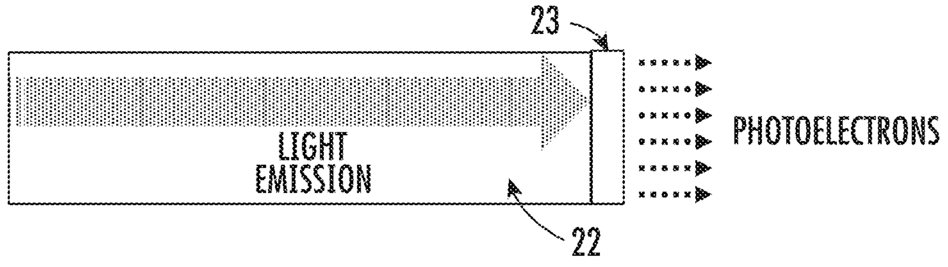
FIG. 15 is a schematic illustration of a partially transparent photocathode attached to an edge of an edge emitting SULS.

In another embodiment referring to FIG. 15, a partially transparent photocathode 23 is attached to the edge of an edge emitting SULS 22. A transition layer, a light extraction layer, and/or a mirror can be attached to the edge of the SULS.

Figure 16:
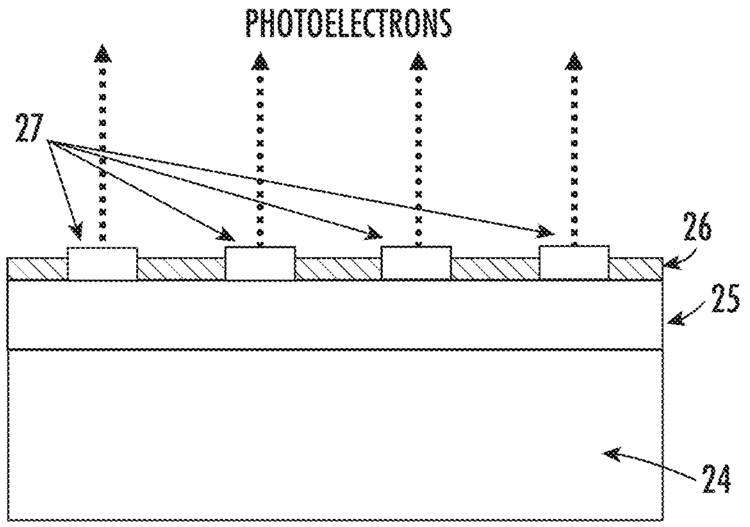
FIG. 16 is a schematic illustration of a patterned photocathode.

In yet another embodiment referring to FIG. 16, a photoelectron generating structure has a patterned photocathode electrode 26 and/or non-continuous partially transparent photocathode layer 27 stacked atop a SULS 24 and another (e.g., transition) layer 25.

Figure 17:
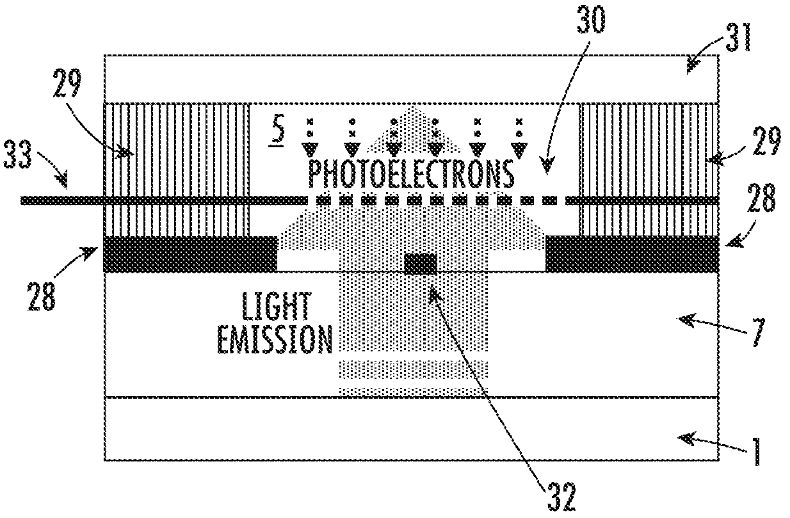
FIG. 17 is a schematic illustration of an electron beam device with an anode attached to a SULS and one control electrode incorporated between a photocathode and an anode.

Referring to FIG. 17, a photoelectron beam is generated, including a SULS 1, an anode 32 attached to SULS 1 via a transition layer 7, incorporated between the SULS and the anode, or embedded in the transition layer 7. Photocathode 31 is separated from anode 32 and anode electrode 28 by a vacuum gap 30 via a separation layer 29, which is a dielectric of having a low electrical conductivity. The area of anode 32 is smaller than the area of SULS 1, so that the light emitted by the SULS can irradiate photocathode 31 and generate photoelectrons. A photoelectron beam is controlled by a voltage applied between the anode electrode 28 and photocathode 31. The electron beam can be manipulated by a controlling electrode 33 incorporated between photocathode 31 and anode 32.

Figure 18:
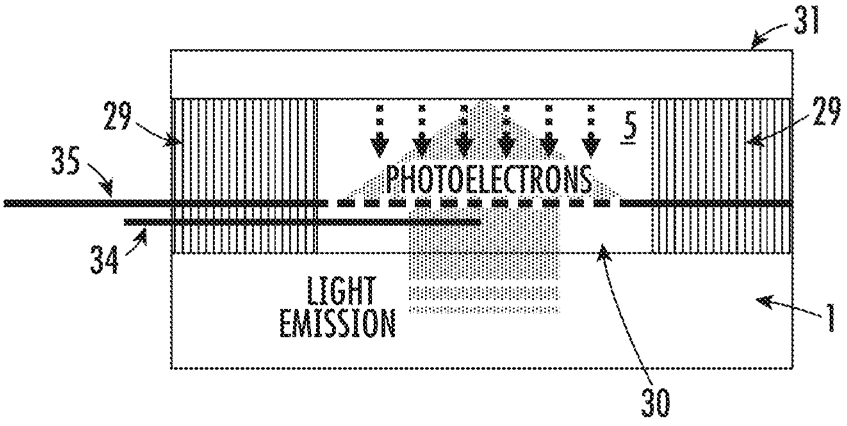
FIG. 18 is a schematic illustration of an electron beam device with an anode incorporated between a photocathode and a SULS and one control electrode incorporated between a photocathode and an anode.

Referring to FIG. 18, in another embodiment anode 34 is incorporated between a SULS 1 and a photocathode 31. The area of anode 34 is smaller than the area of SULS 1, so that the light emitted by the SULS can irradiate photocathode 31 and generate photoelectrons. The photoelectron beam is controlled by a voltage applied between anode 34 and photocathode 31. The photoelectron beam can be manipulated by a controlling electrode 35 incorporated between photocathode 31 and anode 34.

The invention claimed is:

1. A device comprising:

a semiconductor ultraviolet light source;

a photocathode attached to the semiconductor ultraviolet light source, the photocathode having a first surface;

a photocathode electrode attached to the photocathode;

an anode having a first surface facing towards the first surface of the photocathode;

a separation layer located between and in contact with the first surface of the photocathode and the first surface of the anode, the separation layer being configured to create a vacuum gap between the first surface of the photocathode and the first surface of the anode; and an anode terminal connected to the anode and extending distally into the vacuum gap;

wherein the semiconductor ultraviolet light source generates photoelectrons at the first surface of the photocathode that are transmitted via the vacuum gap to the anode terminal, and wherein the semiconductor ultraviolet light source, the photocathode, the photocathode electrode, the anode, the anode terminal, and the separation layer are configured together as a monolithic integrated element.

2. A device comprising:

a semiconductor ultraviolet light source for emitting light;

a transition layer at least partially transparent to the light of the semiconductor ultraviolet light source and attached to the semiconductor ultraviolet light source;

an anode terminal, an anode, and an anode electrode;

the anode being attached to the transition layer;

the anode electrode and the anode terminal being attached to the anode, the anode having a first surface;

a photocathode having a first surface facing towards the first surface of the anode; and a separation layer located between and in contact with the first surface of the photocathode and the first surface of the anode, the separation layer being configured to create a vacuum gap between the first surface of the photocathode and the first surface of the anode;

wherein the anode terminal extends distally into the vacuum gap;

wherein the semiconductor ultraviolet light source generates photoelectrons at a surface of the photocathode that are transmitted via the vacuum gap to the anode terminal, and wherein the semiconductor ultraviolet light source, the transition layer, the anode terminal, the anode, and the anode electrode, the photocathode, and the separation layer are configured together as a monolithic integrated element.

3. A device comprising:

a semiconductor ultraviolet light source;

a photocathode having a first surface;

an anode terminal and an anode, the anode having a first surface facing towards the first surface of the photocathode, the anode being incorporated between the semiconductor ultraviolet light source and the photocathode; and a separation layer located between and in contact with the first surface of the photocathode and the first surface of the anode, the separation layer being configured to create vacuum gaps between the first surface of the photocathode and the first surface of the anode;

wherein the anode terminal extends distally into at least one of the vacuum gaps;

wherein the semiconductor ultraviolet light source generates photoelectrons at a surface of the photocathode that are transmitted via the vacuum gaps to the anode terminal, and wherein the semiconductor ultraviolet light source, the photocathode, the anode terminal, the anode, and the separation layer are configured together as a monolithic integrated element.

4. The device according to claim 1, wherein the semiconductor ultraviolet light source is one of a semiconductor ultraviolet Light Emitting Diode (UV LED), a semiconductor ultraviolet Superluminescent Light Emitting Diode (UV SLED), or a semiconductor ultraviolet Laser Diode (UV LD).

5. The device according to claim 1, wherein the semiconductor ultraviolet light source is one of a vertical emission device or an edge emission device, and is one of a single emission wavelength device or a multiple emission wavelengths device.

6. The device according to claim 1, wherein the photocathode is a layer at least partially transparent to light emitted by the semiconductor ultraviolet light source.

7. The device according to claim 6, wherein the photocathode is a layer of Au.

8. The device according to claim 1, wherein the photocathode includes more than one layer of different materials, each different material having a different electron binding energy, or is a single layer having a graded materials composition along a direction extending through the single layer.

9. The device according to claim 1, wherein the anode terminal has a smaller surface area than a surface area of the anode.

10. The device according to claim 1, wherein the device includes a plurality of anode terminals.

11. The device according to claim 1, wherein an opening is defined in the anode.

12. The device according to claim 11, further including a grid plate located in the opening defined in the anode.

13. The device according to claim 1, further including one or more control electrodes between the anode and the photocathode to control photoelectron flow from the photocathode to the anode terminal.

14. The device according to claim 13, further including an optically reflecting layer attached to a surface of the separation layer.

15. The device according to claim 13, wherein a voltage is applied to at least one of the anode, the photocathode, and the one or more control electrodes, wherein the voltage is one of a constant bias voltage or a pulsed bias voltage, and wherein in the case of a pulsed bias voltage a polarity, an amplitude, a pulse shape, a duration, and a repetition rate of the voltage is controlled by an outside electric circuit.

16. The device according to claim 1, wherein the device includes a plurality of photocathodes.

17. The device according to claim 1, wherein one of: electron beam pumped light emitting devices are incorporated either between the anode and the photocathode or attached to the anode; or hybrid electron beam pumped and current injection light emitting devices are incorporated either between the anode and the photocathode or attached to the anode.

18. The device according to claim 1, wherein the photocathode defines at least one opening facing the semiconductor ultraviolet light source and at least one opening facing the anode.

19. The device according to claim 1, wherein the photocathode is attached to an edge of the semiconductor ultraviolet light source.

20. The device according to claim 1, wherein the photocathode includes a patterned layer including at least one of quantum wells, quantum wires, or quantum dots.

21. The device according to claim 1, wherein a spacing between the anode terminal and the semiconductor ultraviolet light source is smaller than a spacing between the anode and the semiconductor ultraviolet light source.

22. The device according to claim 1, wherein the anode includes one of a dielectric layer or a low electrical conductivity layer on a surface facing the photocathode.

23. The device according to claim 1, wherein the anode terminal includes a patterned material.

24. The device according to claim 1, wherein the separation layer includes one of a dielectric layer or a low electrical conductivity layer.

25. A device comprising:

a semiconductor ultraviolet light source for emitting light;

a transition layer at least partially transparent to the light of the semiconductor ultraviolet light source and attached to the semiconductor ultraviolet light source;

a photocathode attached to the transition layer, the photocathode having a first surface;

a photocathode electrode attached to the photocathode;

an anode having a first surface facing towards the first surface of the photocathode;

a separation layer located between and in contact with the first surface of the photocathode and the first surface of the anode, the separation layer being configured to create a vacuum gap between the first surface of the photocathode and the first surface of the anode; and an anode terminal connected to the anode and extending distally into the vacuum gap;

wherein the semiconductor ultraviolet light source generates photoelectrons at a surface of the photocathode that are transmitted via the vacuum gap to the anode terminal, and wherein the semiconductor ultraviolet light source, the transition layer, the photocathode, the photocathode electrode, the anode, the anode terminal, and the separation layer are configured together as a monolithic integrated element.

26. The device according to claim 25, wherein the transition layer is a substrate on which the semiconductor ultraviolet light source is fabricated.

27. The device according to claim 25, wherein the transition layer is a light extraction layer from the semiconductor ultraviolet light source.

28. The device according to claim 25, wherein the transition layer is a combination of a substrate on which the semiconductor ultraviolet light source is fabricated and a light extraction layer from the semiconductor ultraviolet light source.

29. The device according to claim 25, wherein the transition layer is a patterned transition layer.

30. A device comprising:

a semiconductor ultraviolet light source;

an anode terminal, an anode, and an anode electrode;

the anode being attached to the semiconductor ultraviolet light source;

the anode electrode and the anode terminal being attached to the anode, the anode having a first surface; and a photocathode having a first surface facing towards the first surface of the anode; and a separation layer located between and in contact with the first surface of the photocathode and the first surface of the anode, the separation layer being configured to create a vacuum gap between the first surface of the photocathode and the first surface of the anode;

wherein the anode terminal extends distally into the vacuum gap;

wherein the semiconductor ultraviolet light source generates photoelectrons at a surface of the photocathode that are transmitted via the vacuum gap to the anode terminal, and wherein the semiconductor ultraviolet light source, the anode terminal, the anode, the anode electrode, the photocathode, and the separation layer are configured together as a monolithic integrated element.

31. The device according to claim 30, wherein the anode is embedded in one of the semiconductor ultraviolet light source or a transient layer.

* * * * *